(12) United States Patent
Eder et al.

(10) Patent No.: US 9,142,739 B2
(45) Date of Patent: Sep. 22, 2015

(54) METHOD AND SYSTEM FOR PROVIDING A RELIABLE LIGHT EMITTING DIODE SEMICONDUCTOR DEVICE

(71) Applicant: Infineon Technologies AG, Neubiberg (DE)

(72) Inventors: Andreas Eder, Weissenstein (AT); Henrik Ewe, Burglengenfeld (DE); Stefan Landau, Wehrheim (DE); Joachim Mahler, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 17 days.

(21) Appl. No.: 13/921,060

(22) Filed: Jun. 18, 2013

(65) Prior Publication Data

US 2013/0277704 A1    Oct. 24, 2013

Related U.S. Application Data

(62) Division of application No. 12/878,043, filed on Sep. 9, 2010, now abandoned.

(51) Int. Cl.

| | |
|---|---|
| *H01L 33/56* | (2010.01) |
| *H01L 33/54* | (2010.01) |
| *H01L 33/62* | (2010.01) |
| *H01L 23/00* | (2006.01) |

(52) U.S. Cl.
CPC ............... *H01L 33/56* (2013.01); *H01L 24/24* (2013.01); *H01L 24/82* (2013.01); *H01L 24/97* (2013.01); *H01L 33/54* (2013.01); *H01L 33/62* (2013.01); *H01L 2224/32225* (2013.01); *H01L 2224/32245* (2013.01); *H01L 2224/73267* (2013.01); *H01L 2224/97* (2013.01); *H01L 2924/12041* (2013.01); *H01L 2924/1305* (2013.01); *H01L 2924/13055* (2013.01); *H01L 2924/1461* (2013.01); *H01L 2933/0066* (2013.01)

(58) Field of Classification Search
CPC ......... H01L 33/54; H01L 33/56; H01L 33/62; H01L 24/97; H01L 24/24; H01L 24/82; H01L 2924/1305; H01L 2924/1461; H01L 2924/12041; H01L 2924/97; H01L 2933/0066
USPC .......... 257/98, 62, 79, 773, E33/059, E23.01; 438/27, 26

See application file for complete search history.

(56) References Cited

U.S. PATENT DOCUMENTS

| | | | |
|---|---|---|---|
| 2008/0035935 A1 | 2/2008 | Shum | |
| 2010/0301367 A1 | 12/2010 | Nakamura et al. | |
| 2012/0104562 A1 | 5/2012 | Pagaila et al. | |
| 2012/0319304 A1* | 12/2012 | Pressel et al. | 257/787 |
| 2012/0322178 A1* | 12/2012 | Guenther et al. | 438/26 |

FOREIGN PATENT DOCUMENTS

| | | |
|---|---|---|
| DE | 19954941 A1 | 6/2001 |
| DE | 102007017831 A1 | 10/2008 |

\* cited by examiner

*Primary Examiner* — Cathy N Lam
(74) *Attorney, Agent, or Firm* — Slater & Matsil, L.L.P.

(57) ABSTRACT

A method and a system for a reliable LED semiconductor device are provided. In one embodiment, the device comprises a carrier, a light emitting diode disposed on the carrier, an encapsulating material disposed over the light emitting diode and the carrier, at least one through connection formed in the encapsulating material, and a metallization layer disposed and structured over the at least one through connection.

21 Claims, 12 Drawing Sheets

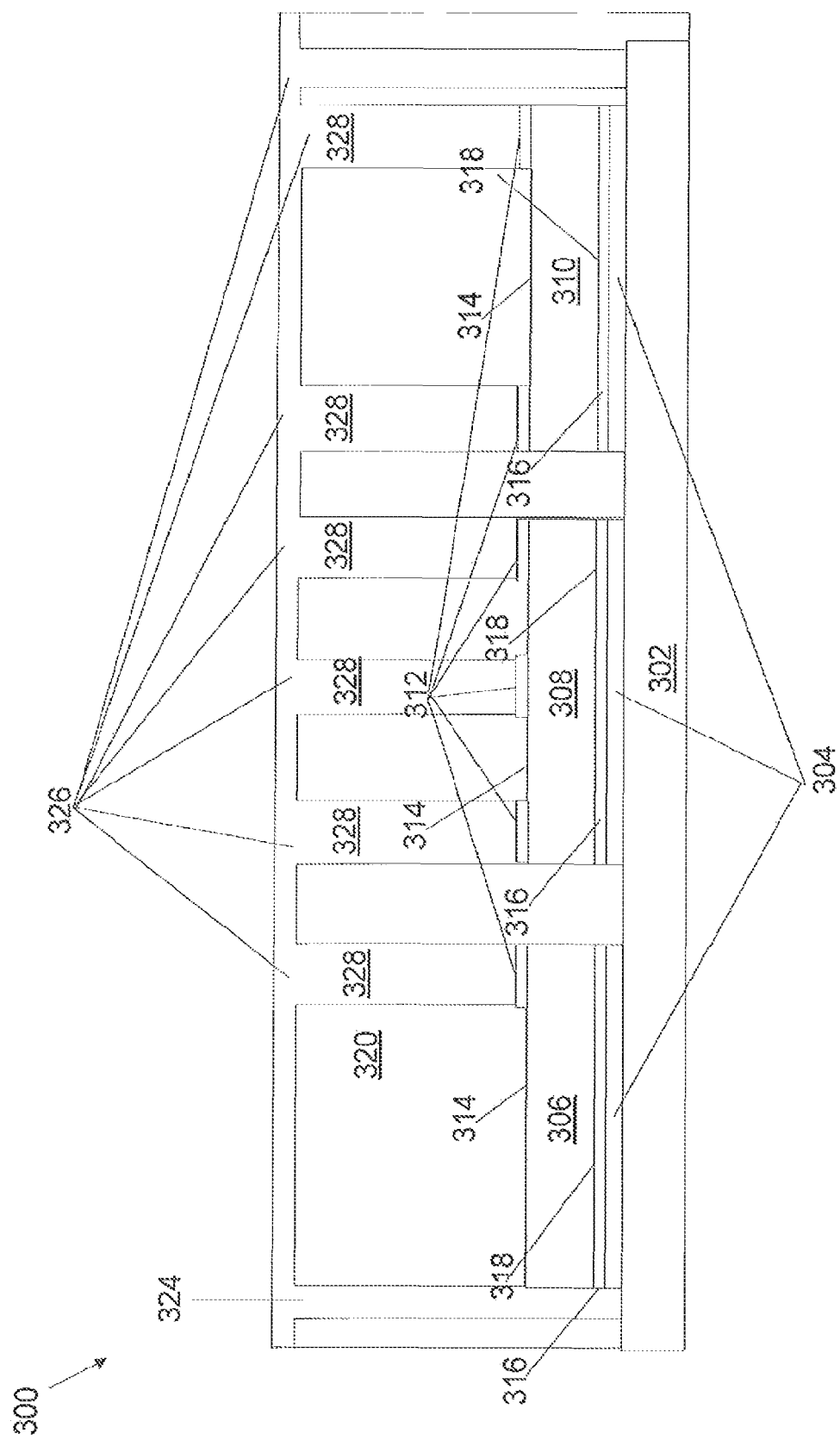

METHOD AND SYSTEM FOR PROVIDING A RELIABLE LIGHT EMITTING DIODE SEMICONDUCTOR DEVICE

This is a divisional application of U.S. application Ser. No. 12/878,043, which was filed on Sep. 9, 2010 and is incorporated herein by reference.

TECHNICAL FIELD

The present invention relates generally to a reliable light emitting diode (LED) semiconductor device. In particular, the present disclosure relates to a method and system for encapsulating and embedding LEDs to provide a reliable LED semiconductor device.

BACKGROUND

LEDs have been used widely in many applications due to its light sensing capability. In many current semiconductor applications, LEDs are mounted directly on a printed circuit board as individual components and electrically connected to other components, such as power and logic components, on the board. In other applications, LEDs are placed into semiconductor devices using silicone or silicon-based materials. These materials, however, has poor performances due to its high coefficient of thermal expansion (CTE), poor adhesive to metal and high moisture permeability. Therefore, a need exists for a method and system to provide a reliable LED semiconductor device that provides a better performance.

SUMMARY OF THE INVENTION

The present disclosure provides a reliable LED semiconductor device. In one embodiment, the device comprises a carrier, a light emitting diode disposed on the carrier, an encapsulating material disposed over the light emitting diode and the carrier, at least one through connection formed in the encapsulating material, and a metallization layer disposed and structured over the at least one through connection.

In another embodiment, the device comprises a carrier, a light emitting diode and at least one semiconductor chip disposed on the carrier, an encapsulating material disposed over the light emitting diode, the at least one semiconductor device and the carrier, at least one through connection formed in the encapsulating material, and a metallization layer disposed and structured over the at least one through connection.

In yet another embodiment, a method for forming a reliable LED semiconductor device is provided. The method comprises providing a carrier, disposing at least one light emitting diode on the carrier, encapsulating the at least one light emitting diode and the carrier with an encapsulating material, forming at least one through connection in the encapsulating material, and forming a metallization layer over the at least one through connection.

BRIEF DESCRIPTION OF THE DRAWINGS

For a more complete understanding of the present invention, and the advantages thereof, reference is now made to the following descriptions taken in conjunction with the accompanying drawing, in which:

FIGS. 3A to 3E are diagrams illustrating a reliable LED semiconductor package in accordance with one embodiment of the present disclosure.

DETAILED DESCRIPTION OF ILLUSTRATIVE EMBODIMENTS

Figure 1A:
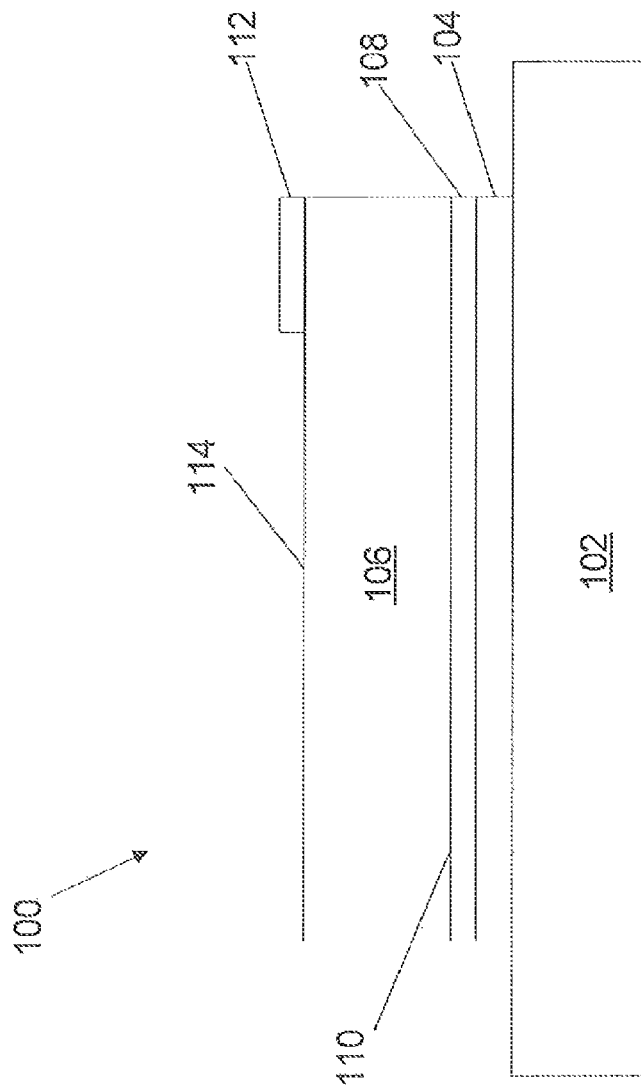
FIGS. 1A to 1E are diagrams illustrating an exemplary process for forming a reliable LED semiconductor device accordance with one embodiment of the present disclosure.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Devices with semiconductor chips are described below. The semiconductor chips may be of extremely different types, may be manufactured by different technologies and may include for example, integrated electrical or electro-optical circuits or passives or MEMS etc. Semiconductor chips may be configured, for example, as power transistors, power diodes, IGBTs (Isolated Gate Bipolar Transistors). Semiconductor chips may have a vertical structure and may be fabricated in such a way that electrical currents can flow in a direction perpendicular to the main surfaces of the semiconductor chips. These semiconductor chips may have contact elements disposed on its main surfaces, which includes a top surface and a bottom surface. Examples of semiconductor chips having a vertical structure include power transistors and power diodes. In case of power transistors, the source electrode and the gate electrode may be disposed on a first main surface while the drain electrode may be disposed on a second main surface. In case of a power diode, the anode electrode may be disposed on a first main surface while the cathode electrode may be disposed on a second main surface.

The integrated circuits may, for example, be designed as logic integrated circuits, analog integrated circuits, mixed signal integrated circuits, power integrated circuits, memory circuits or integrated passives. Furthermore, the semiconductor chips may be configured as MEMS (micro-electro mechanical systems) and may include micro-mechanical structures, such as bridges, membranes or tongue structures. The semiconductor chips may be configured as sensors or actuators, for example, pressure sensors, acceleration sensors, rotation sensors, microphones etc. The semiconductor chips may be configured as antennas and/or discrete passives. The semiconductor chips may also include antennas and/or discrete passives. Semiconductor chips, in which such functional elements are embedded, generally contain electronic circuits which serve for driving the functional elements or further process signals generated by the functional elements. The semiconductor chips need not be manufactured from specific semiconductor material and, furthermore, may contain inorganic and/or organic materials that are not semiconductors, such as for example, discrete passives, antennas, insulators, plastics or metals. Moreover, the semiconductor chips may be packaged or unpackaged.

The semiconductor chips have contact elements which allow electrical contact to be made with the semiconductor chips. The contact elements may be composed of any desired electrically conductive material, for example, of a metal, such as aluminum, nickel, palladium, gold or copper, a metal alloy, a metal stack or an electrically conductive organic material. The contact elements may be situated on the active main surfaces of the semiconductor chips or on other surfaces of the semiconductor chips. The active or passive structures of the semiconductor chips are usually arranged below the active main surfaces and can be electrically contacted via the contact elements. In case of power transistors, the contact elements may be drain, source or date electrodes The devices described in the following may include external contact elements that are accessible from outside of the devices to allow electrical contact to be made from outside of the devices. In addition, the external contact elements may be thermally conductive and serve as heat sinks for heat dissipation of the semiconductor chips. The external contact elements may be composed of any electrically conductive material, for example, a metal such as copper, Pd, Ni, Au, etc.

The devices described in the following may include an encapsulating material covering at least parts of the semiconductor chips. The encapsulating material is an electrically insulating material, which is at most marginally electrically conductive relative to the electrically conductive components of the device. Examples of an encapsulating material include a mold material and an epoxy based material. The encapsulating material may be any appropriate duroplastic, thermoplastic, laminate (prepreg) or thermosetting material and may contain filler materials. Various techniques may be employed to cover the semiconductor chips with the mold material, for example, compression molding, lamination or injection molding.

The present disclosure provides a method and system for a reliable LED semiconductor device by encapsulating LEDs with a special encapsulating material that is highly transparent, in particular, to the blue color spectrum, and has good adhesion to metals. In addition, the transparent encapsulating material has a low coefficient of thermal expansion and stability under high temperature. The resulting device is therefore easily integrated with other semiconductor devices and processes without affecting the performance of the LEDs.

Referring to FIGS. 1A to 1E, diagrams illustrating an exemplary process for forming a reliable LED semiconductor device are depicted in accordance with one embodiment of the present disclosure. As shown in FIG. 1A, a reliable LED semiconductor device 100 is provided which comprises a carrier 102 serving as a lead frame. The carrier 102 may be made of metals, ceramics, plastics or any other types of material. The carrier 102 may be a structured or unstructured lead frame. An adhesive layer 104 is then applied over the carrier 102 for attaching the LED 106. The adhesive layer 104 may be made of any adhesive material, such as metallic glue. LED 106 is placed onto the carrier 102 over the adhesive layer 104. The LED 106 may comprise a first electrical contact 108 disposed on the back surface 110 of LED 106 and a second electrical contact 112 disposed on the top surface 114 of LED 106.

Figure 1B:
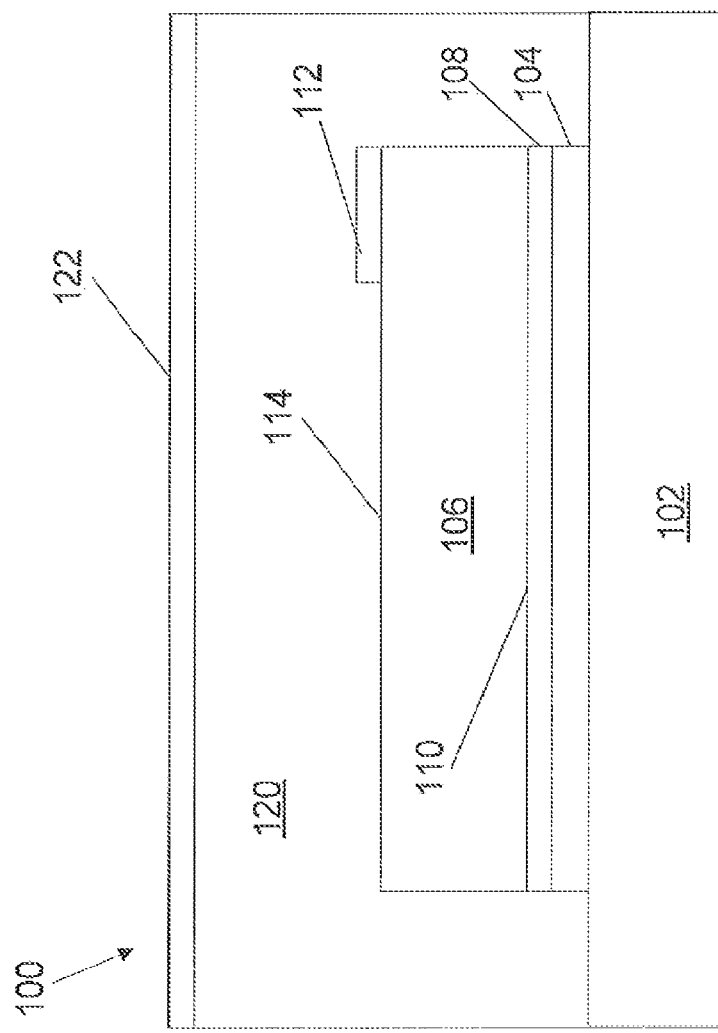

Referring to FIG. 1B, a highly transparent encapsulating material 120 is applied to encapsulate carrier 102 and LED 106. In one embodiment, the encapsulating material may be a reliable polymer material, such as acrylic resins, ormocers, epoxy-acrylate copolymer, silicon epoxy copolymer, etc. Alternatively, the encapsulating material may be made of other polymer materials such as epoxy resins, which increases elasticity of the structure and provides good light transmission for a given wavelength range.

These types of encapsulating material have a very low light absorption in the full range of LED light wavelengths, but particularly, in a short wavelength range. In one example, these types of encapsulating material have a light absorption of less than five percent, but preferably less than one percent, over a full range of LED light wavelengths. The LED wavelengths may range anywhere from infrared to ultra-violet.

In addition, these materials provide excellent adhesion to metals, in particular, to copper surfaces, and other types of materials, such as polymers and ceramics. These materials also have a low coefficient of thermal expansion, for example, less than 50 ppm/K, which provides stability even in high temperature, for example, temperature greater than 150.degree. C. The encapsulating material 120 may be applied by molding or other encapsulation methods.

Optionally, a thin metal layer 122 is applied over the encapsulating material 120. The metal layer 122 may be made of metals such as copper to provide a RCC film. The metal layer 122 may serve as a heat sink or dissipation for the structure or electrical contacts and redistribution layer for the LED 106. The thickness of the metal layer 122 may be a few micrometers. However, metal layer 122 may be made of other types of metals or may have different thickness without departing the spirit and scope of the present disclosure.

Figure 1C:
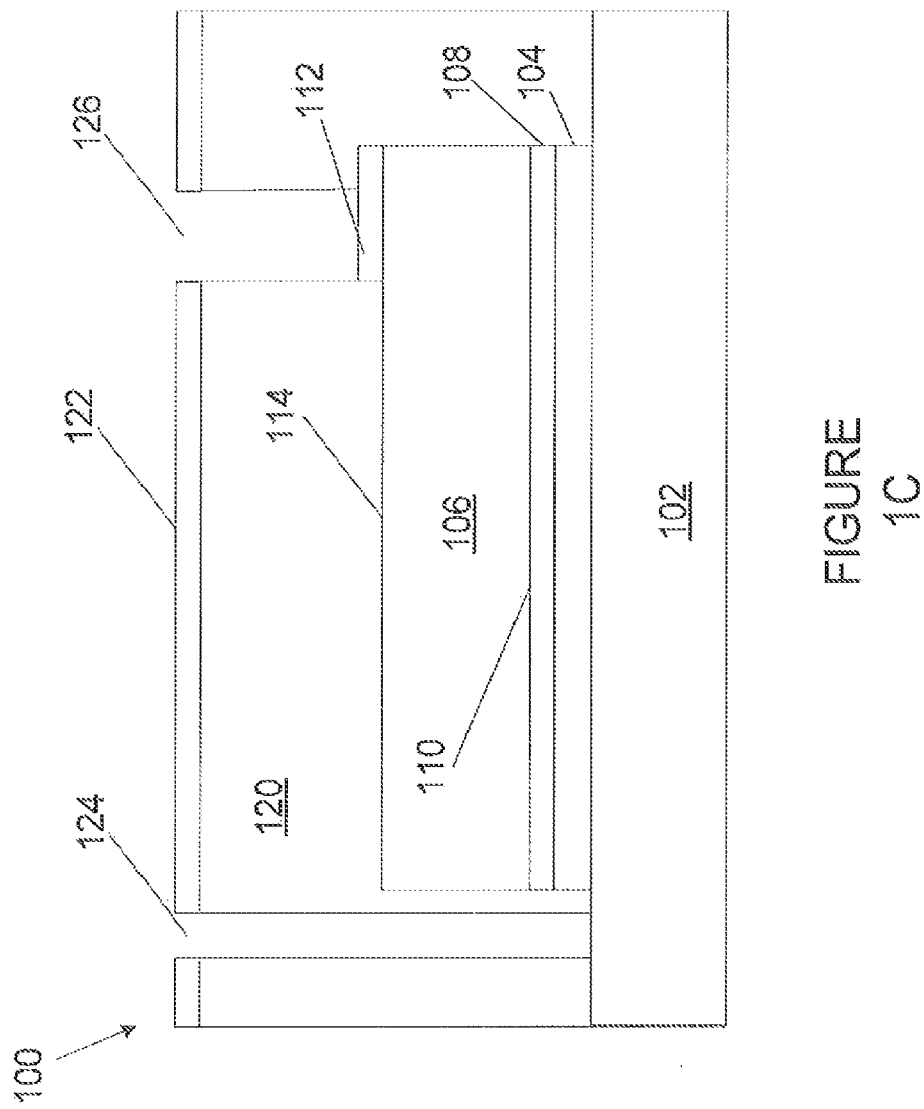

Referring to FIG. 1C, a plurality of via openings 124, 126 are formed in the encapsulating material 120 and optionally, the metal layer 122, to provide through connections to the electrical contacts 108 and 112 of LED 106. For example, via opening 124 is formed to provide a through connection to first electrical contact 108 disposed on the back surface 110 of LED 106. Via opening 126 is formed to provide a through connection to the second electrical contact 112 disposed on the top surface 114 of LED 106.

In one embodiment, the plurality of via openings 124, 126 may be formed using laser drilling or plasma etching. However, other methods for forming the plurality of via openings may be used without departing the spirit and scope of the present disclosure.

Figure 1D:
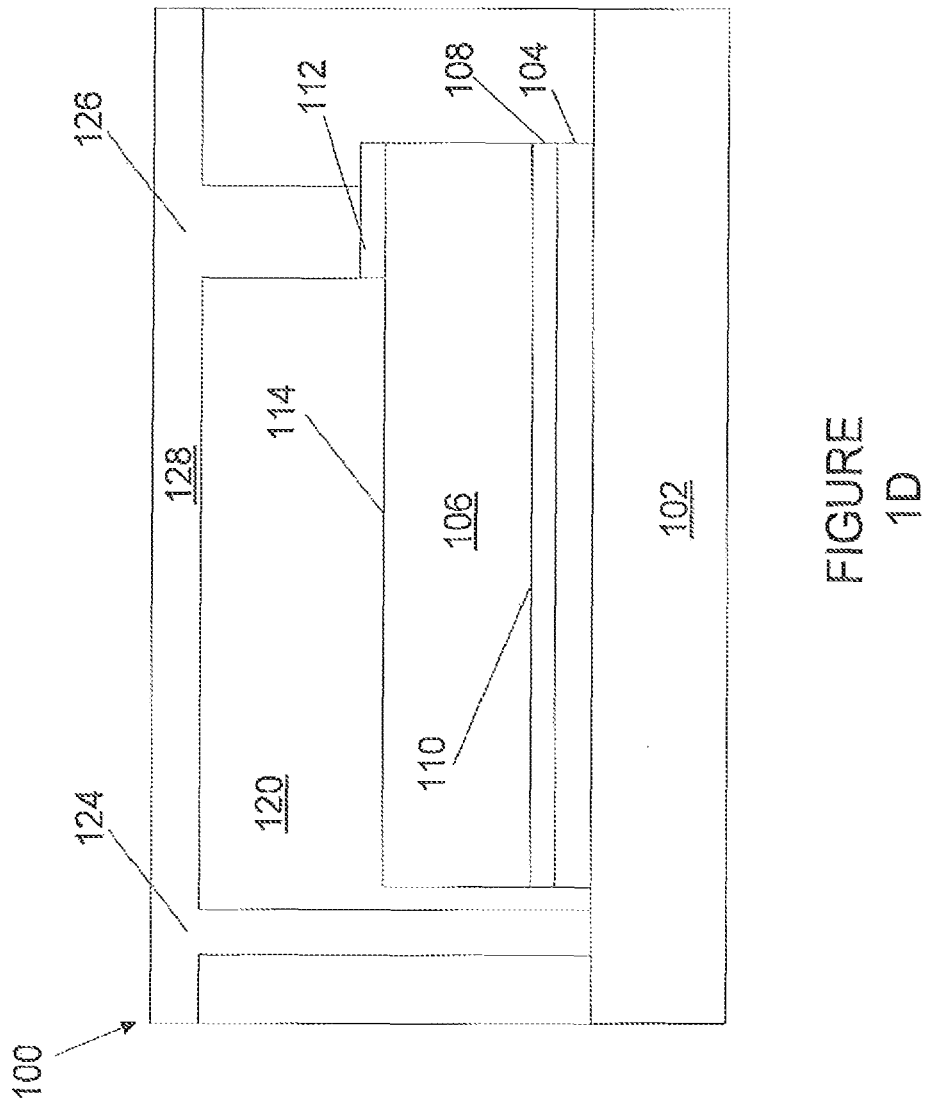

Referring to FIG. 1D, the plurality of via openings 124, 126 may be filled with a metal, such as copper, to form a metallization layer 128. To fill the plurality of via openings, a barrier layer may first be deposited (e.g. sputtered) over the plurality of via openings, in this example, via openings 124, 126 and optionally the metal layer 122. The barrier layer may be composed of an electrically conductive material, such as chrome or titanium or an alloy of different metals like titanium and tungsten. Then, a seed layer may be deposited (e.g. sputtered) onto the barrier layer. The seed layer may be composed of an electrically conductive material, such as copper.

After a barrier and/or seed layer is applied, another layer of electrically conductive material, such as copper, or multiple layers of similar or different electrically conductive materials, such as copper, nickel, gold or palladium is galvanically deposited. The electrically conductive material may be copper or any other conductive metal, and may consist of a layer stack of different metals, such as Copper, Nickel and Gold or copper, nickel and copper or copper, nickel and palladium.

Before the electrically conductive material is applied, a plating resist is placed over the barrier and/or seed layer. The plating resist may be placed over the entire barrier and/or seed layer except the plurality of via openings, such as via openings 124, 126, and the wafer edge (edge exclusion). Typically, the plating resist is exposed and developed after application with photolithography mask (Mask Aligner) or a reticle (Stepper). Another possibility would be to structure the resist by laser (e.g. laser direct imaging) or apply the electrically conductive material already structured (e.g. printing). Dual damascene redistribution is possible as well.

After electrically conductive material is applied into areas not covered by the plating resist, the plating resist is stripped and the barrier and/or seed layer are removed chemically, for example, by wet etching. The plating resist may be removed easily with common resist stripping technique. The barrier and/or seed layer may be removed by wet etching. However, portions of the barrier and/or seed layer may be removed using other methods without departing the spirit and scope of the present disclosure.

Figure 1E:
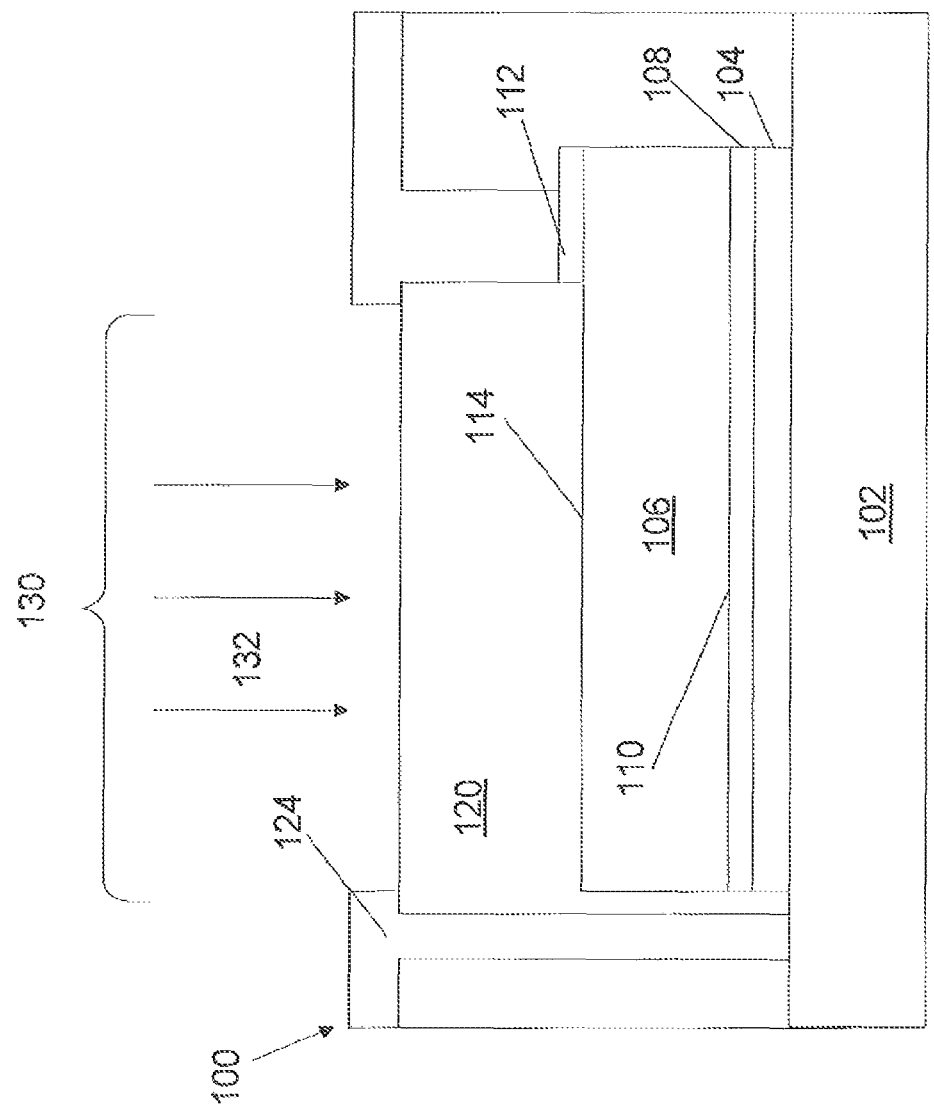

Referring to FIG. 1E, after the plating resist and the barrier and/or seed layer is removed, metallization layer 128 is formed. The metallization layer 128 is then structured to provide electrical connection to external component, such as a print circuit board. In this example, portions of the metallization layer 128 are removed by ablation, such as photolithography. As shown in FIG. 1E, portion 130 of metallization layer 128 is removed by ablation, which in turn exposes the highly transparent encapsulating material 120. The exposed highly transparent encapsulating material 120 allows LED 106 to absorb a full range of LED light wavelengths 132, including the blue color spectrum.

Figure 2:
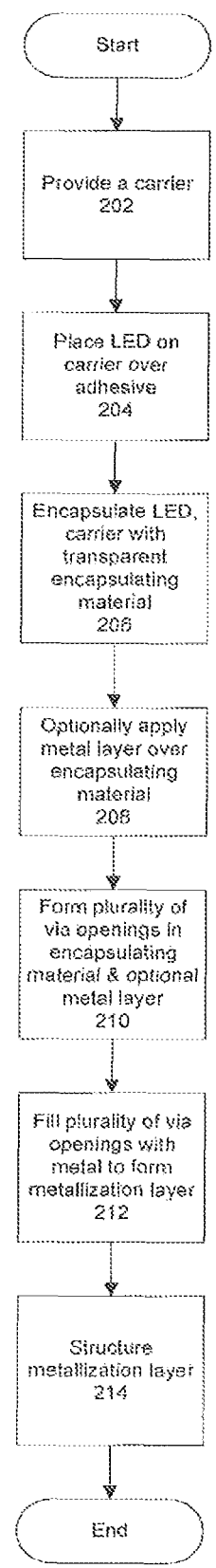
FIG. 2 is a flowchart of an exemplary process for forming a reliable LED semiconductor in accordance with one embodiment of the present disclosure.

Referring to FIG. 2, a flowchart of an exemplary process for forming a reliable LED semiconductor package is depicted in accordance with one embodiment of the present disclosure. Process 200 begins at step 202 to provide a carrier as a lead frame. For example, a metal carrier 102 is provided as a lead frame. Process 200 then continues to step 204 to place an LED on the carrier over an adhesive layer. For example, LED 106 is placed onto carrier 102 over adhesive layer 104.

Process 200 then continues to step 206 to encapsulate the LED and the carrier with a highly transparent encapsulating material. For example, encapsulating material 120 is applied to encapsulate LED 106 and carrier 102. The encapsulating material may be a reliable polymer material, such as acrylic resins, epoxy-acrylate copolymer, or other materials such as epoxy resins, that provides elasticity of the structure and good light transmission in a given wavelength range.

Process 200 then continues to step 208 to optionally apply a metal layer over the encapsulating material. For example, a metal layer 122, made of copper, may be applied over the encapsulating material 120. Process 200 then continues to step 210 to form a plurality of via openings in the encapsulating material and the optional metal layer to provide through connections to electrical contacts of the LED. For example, via openings 124, 126 may be formed in metal layer 122 and encapsulating material 120 using laser drilling or plasma etching to provide through connections to contacts 114 and 108 of LED 106.

To protect contacts 114 and 108 from laser damage, an organic protective layer may be applied over the LED 106, including at least contacts 114 and 108 of the LED 106. Alternatively, a thin organic layer, referred to as optional conversion layer may be applied between contacts 114 and 108 of LED 106 and the organic sacrificial layer of the LED 106 to adjust the LED emitted light wavelength to a desired color spectrum.

Process 200 then continues to step 212 to fill the plurality of via openings with a metal to form a metallization layer. For example, via openings 124, 126 may be filled with copper to form metallization layer 128. Process 200 then completes at step 214 to structure the metallization layer. For example, portion 130 of metallization layer 128 is removed by ablation to expose the transparent encapsulating material 120.

In addition to an LED semiconductor device 100 as illustrated above, the present disclosure provides a method and system for a reliable LED semiconductor package, which embeds the LED semiconductor device along with other semiconductor devices, such as power and logic components. Referring to FIGS. 3A to 3E, diagrams illustrating a reliable LED semiconductor package are depicted in accordance with one embodiment of the present disclosure.

Figure 3A:
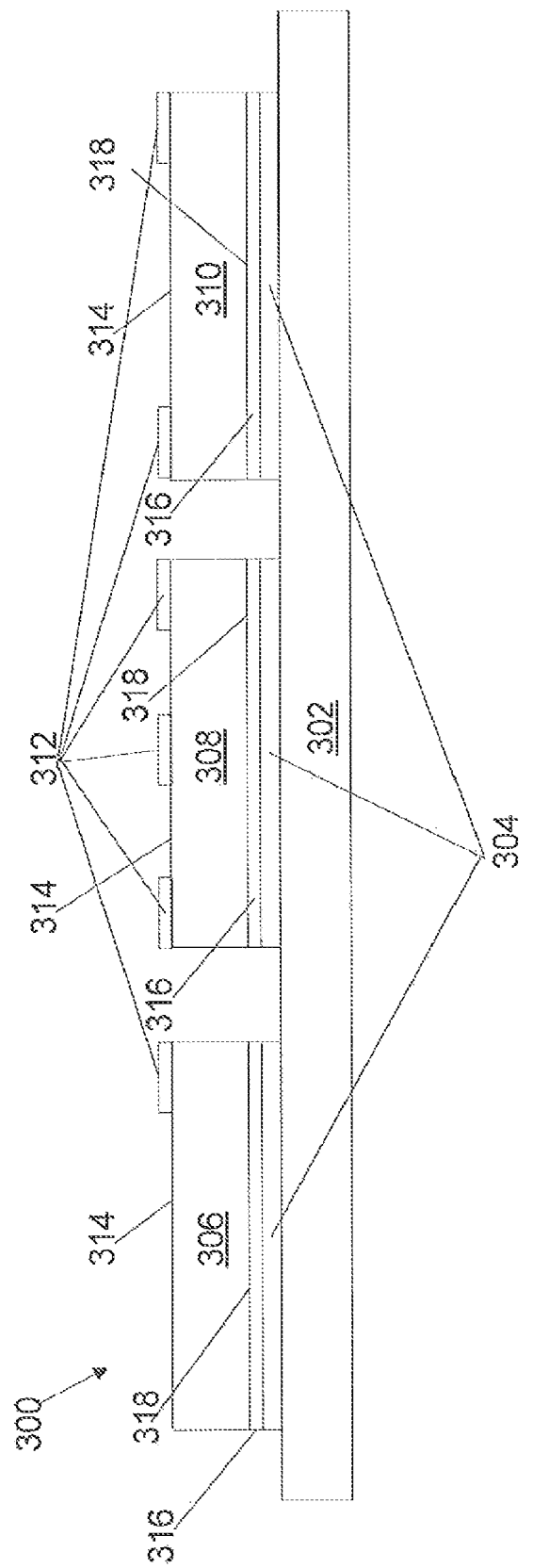

As shown in FIG. 3A, a plurality of semiconductor devices may be placed onto a carrier 302. For example, an LED 306, an integrated circuit 308 for logic operations, and a power semiconductor device 310 may be placed onto carrier 302. In one embodiment, the semiconductor devices 306, 308, and 310 may be placed onto carrier 302 over adhesive layer 304. Semiconductor devices 306, 308, and 310 may comprise first electrical contacts 312 on top surfaces 314 and second electrical contacts 316 on back surfaces 318 of devices 306, 308, and 310 for electrical connections to external components.

Figure 3B:
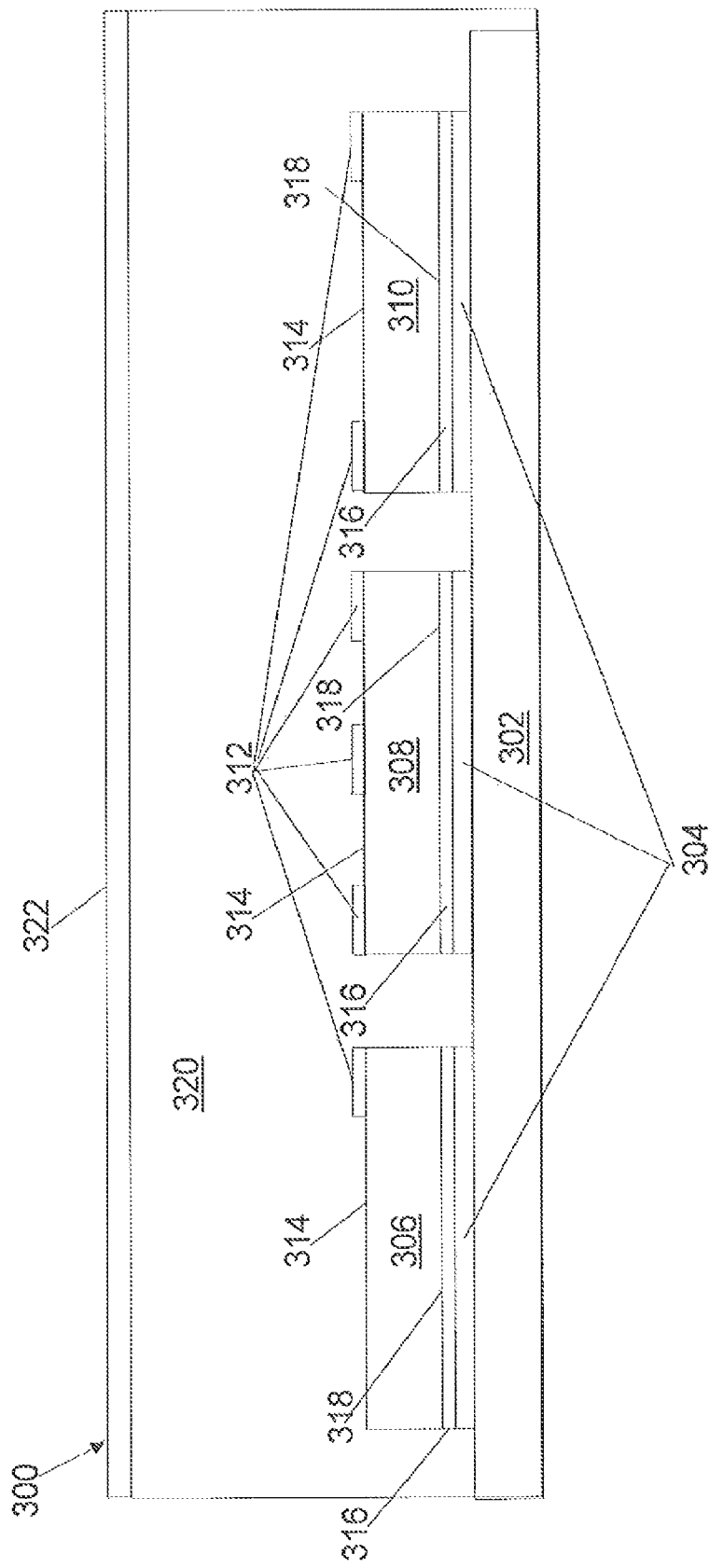

Referring to FIG. 3B, a highly transparent encapsulating material 320 is applied to encapsulate carrier 302, LED 306, IC 308, and power component 310. In one embodiment, the highly transparent encapsulating material 320 may be applied to encapsulate the LED 306, the carrier 302, the IC 308 and the power component 310 together. In another embodiment, the highly transparent encapsulating material may be disposed over the LED 306 alone, to provide low light absorption, low thermal coefficient and good adhesion to metals, while a second type of encapsulating material, or a common encapsulating material, such as epoxy, may be disposed over the carrier 302, the IC 308 and the power component 310. In this way, the cost of encapsulation may be reduced.

In one embodiment, the encapsulating material 320 may be a reliable polymer material, such as acrylic resins, ormocers, silicon epoxy copolymer, epoxy-acrylate copolymer, etc. Alternatively, the encapsulating material 320 may be made of other materials such as epoxy resins, which increases elasticity of the structure and provides good light transmission for a given wavelength range.

These types of encapsulating material have a very low light absorption in the full range of LED light wavelengths, but particularly, in a short wavelength range. In one example, these types of encapsulating material have a light absorption of less than five percent, but preferably less than one percent, over a full range of LED light wavelengths. The LED wavelengths may range anywhere from infrared to ultra-violet.

In addition, these materials provide excellent adhesion to metals, in particular, to copper surfaces, and other types of materials, such as polymers and ceramics. These materials also have a low coefficient of thermal expansion, for example, less than 50 ppm/K, which provides stability even in high temperature, for example, temperature greater than 150.degree. C. The encapsulating material 320 may be applied by molding or other encapsulation methods.

Optionally, a thin metal layer 322 is applied over the encapsulating material 320. The metal layer 322 may be made of metals such as copper to provide a RCC film. The metal layer 322 may serve as a heat sink or dissipation for the structure or electrical contacts and redistribution layer for devices 306, 308, and 310. The thickness of the metal layer 322 may be a few micrometers. However, metal layer 322 may be made of other types of metals or may have different thickness without departing the spirit and scope of the present disclosure.

Figure 3C:
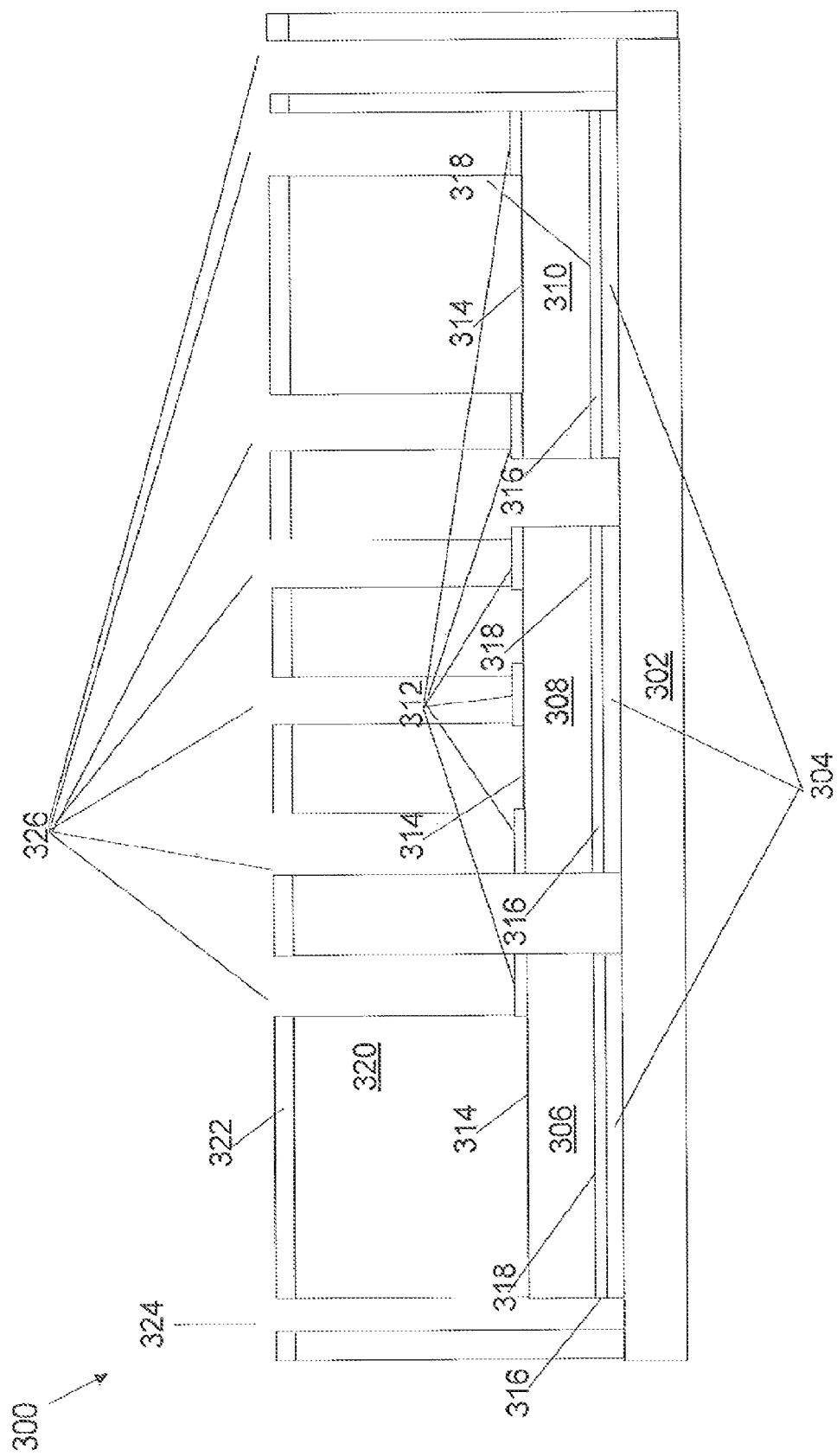

Referring to FIG. 3C, a plurality of via openings 324, 326 are formed in the encapsulating material 320 and optionally, the metal layer 322, to provide through connections to the first electrical contacts 312 on top surfaces 314 and second electrical contacts 316 on back surfaces 318 of devices 306, 308, and 310. In one embodiment, the plurality of via openings 324, 326 may be formed using laser drilling or plasma etching. However, other methods for forming the plurality of via openings may be used without departing the spirit and scope of the present disclosure.

Referring to FIG. 3D, the plurality of via openings 324, 326 may be filled with a metal, such as copper, to form a metallization layer 328. To fill the plurality of via openings 324, 326, a barrier layer may first be deposited (e.g. sputtered) over the plurality of via openings, in this example, via openings 324, 326 and the optional metal layer 322. The barrier layer may be composed of an electrically conductive material, such as chrome or titanium or an alloy of different metals like titanium and tungsten. Then, a seed layer may be deposited (e.g. sputtered) onto the barrier layer. The seed layer may be composed of an electrically conductive material, such as copper.

After a barrier and/or seed layer is applied, another layer of electrically conductive material, such as copper, or multiple layers of similar or different electrically conductive materials, such as copper, nickel, gold or palladium is galvanically deposited. The electrically conductive material may be copper or any other conductive metal, and may consist of a layer stack of different metals, such as Copper, Nickel and Gold or copper, nickel and copper or copper, nickel and palladium.

Before the electrically conductive material is applied, a plating resist is placed over the barrier and/or seed layer. The plating resist may be placed over the entire barrier and/or seed layer except the plurality of via openings, such as via openings 324, 326 and the wafer edge (edge exclusion). Typically, the plating resist is exposed and developed after application with photolithography mask (Mask Aligner) or a reticle (Stepper). Another possibility would be to structure the resist by laser (e.g. laser direct imaging) or apply the electrically conductive material already structured (e.g. printing). Dual damascene redistribution is possible as well.

After electrically conductive material is applied into areas not covered by the plating resist, the plating resist is stripped and the barrier and/or seed layer are removed chemically, for example, by wet etching. The plating resist may be removed easily with common resist stripping technique. The barrier and/or seed layer may be removed by wet etching. However, portions of the barrier and/or seed layer may be removed using other methods without departing the spirit and scope of the present disclosure.

Figure 3E:
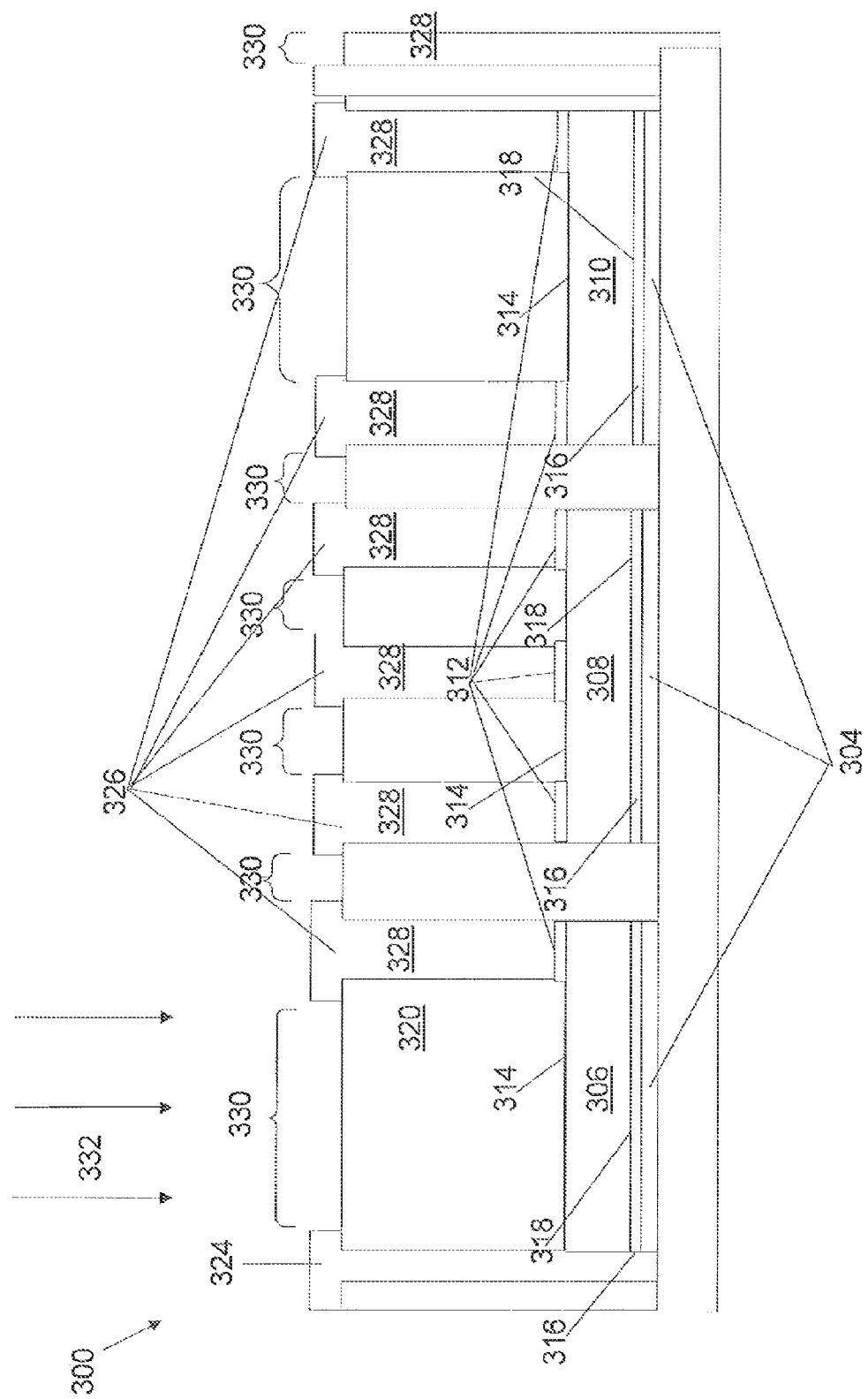

Referring to FIG. 3E, after the plating resist and the barrier and/or seed layer are removed, metallization layer 328 is formed. The metallization layer 328 is then structured to provide connection to external component, such as a print circuit board. In this example, portions of the metallization layer 328 are removed by ablation, such as photolithography. As shown in FIG. 3E, portions 330 of metallization layer 328 are removed by ablation, which in turn exposes the highly transparent encapsulating material 320. The exposed highly transparent encapsulating material 320 allows LED 306 to absorb a full range of LED light wavelengths 332, including the blue color spectrum.

Figure 4:
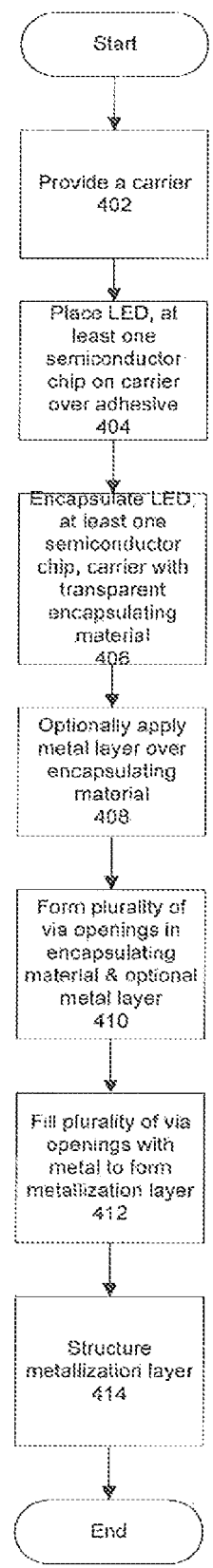
FIG. 4 is a flowchart of an exemplary process for forming a reliable LED semiconductor package in accordance with one embodiment of the present disclosure.

Referring to FIG. 4, a flowchart of an exemplary process for forming a reliable LED semiconductor package is depicted in accordance with one embodiment of the present disclosure. Process 400 begins at step 402 to provide a carrier as a lead frame. For example, a metal carrier 302 is provided as a lead frame. Process 200 then continues to step 404 to place an LED and at least one semiconductor chip on the carrier over an adhesive layer. For example, LED 306, integrated circuit 308, and power semiconductor chip 310 are placed onto carrier 302 over adhesive layer 304.

Process 400 then continues to step 406 to encapsulate the LED, the at least one semiconductor chip and the carrier with a highly transparent encapsulating material. For example, encapsulating material 120 is applied to encapsulate LED 306, integrated circuit 308, power semiconductor chip 310 and carrier 302. The encapsulating material may be a reliable polymer material, such as acrylic resins, epoxy-acrylate copolymer, or other epoxy materials such as epoxy resins, that provides elasticity of the structure and provides good light transmission in a given wavelength range.

Process 400 then continues to step 408 to optionally apply a metal layer over the encapsulating material. For example, a copper layer 322 may be applied over the encapsulating material 320. Process 400 then continues to step 410 to form a plurality of via openings in the encapsulating material and the optional metal layer to provide through connections to electrical contacts of the LED. For example, via openings 324, 326 may be formed in copper layer 322 and encapsulating material 320 using laser drilling or plasma etching to provide through connections to contacts 312 and 316 of devices 306, 308, and 310. To protect contacts 312 and 316 from laser damage, an organic protective layer may be applied over the LED 306, including at least contacts 312 and 316 of the LED 306. Alternatively, a thin organic layer, referred to as optional conversion layer may be applied between contacts 312 and 316 of LED 306 and the organic sacrificial layer of the LED 306 to adjust the LED emitted light wavelength to a desired color spectrum.

Process 400 then continues to step 412 to fill the plurality of via openings with a metal to form a metallization layer. For example, via openings 324, 326 may be filled with copper to form metallization layer 328. Process 400 then completes at step 414 to structure the metallization layer. For example, portions 330 of metallization layer 328 are removed by ablation to expose the transparent encapsulating material 320.

Thus, the present disclosure also provides a method and a system for embedding LEDs in a semiconductor package along with other semiconductor devices by using a transparent encapsulating material. The method and system provide a reliable solution for embedding LEDs without damaging the LED surface during the process and provide desirable properties for LED light absorption.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for forming a semiconductor device comprising:
   providing a carrier comprising a lead frame;
   disposing at least one light emitting diode on the carrier;
   encapsulating the at least one light emitting diode with an encapsulating material, wherein the encapsulating material is configured to absorb less than five percent of light emitted from the at least one light emitted diode over a full range of wavelengths ranging from infrared light to ultra-violet light;
   forming at least one through connection in the encapsulating material; and
   forming a metallization layer over the at least one through connection.

2. The method of claim 1, wherein encapsulating the at least one light emitting diode and the carrier with the encapsulating material comprises:
   encapsulating the at least one light emitting diode and the carrier with an encapsulating material having a low coefficient of thermal expansion.

3. The method of claim 1, wherein encapsulating the at least one light emitting diode with the encapsulating material comprises:
   encapsulating the at least one light emitting diode with a low light absorbing material absorbing light in a full wavelength range, wherein the low light absorbing material absorbs less than one percent of light emitted from the at least one light emitted diode over a full range of wavelengths ranging from infrared light to ultra-violet light.

4. The method of claim 3, wherein encapsulating the at least one light emitting diode with the encapsulating material comprises:
   encapsulating the at least one light emitting diode with a low light absorbing material absorbing light in a short wavelength range of the full wavelength range.

5. The method of claim 1, wherein encapsulating the at least one light emitting diode with the encapsulating material comprises:
   encapsulating the at least one light emitting diode with an encapsulating material that is highly transparent.

6. The method of claim 1, further comprising:
   forming a metal layer over the encapsulating material.

7. The method of claim 6, wherein forming at least one through connection in the encapsulating material comprises:
   forming at least one via opening in the encapsulating material and the metal layer.

8. The method of claim 1, wherein forming a metallization layer over the at least one through connection comprises:
   filling the at least one through connection with a metal; and
   removing portions of the metal to expose the encapsulating material.

9. The method of claim 1, further comprising:
   encapsulating at least one semiconductor chip and the carrier with the encapsulating material.

10. The method of claim 1, further comprising:
    encapsulating at least one semiconductor chip and the carrier with an encapsulating material different from the encapsulating material for encapsulating the at least one light emitting diode.

11. A method for forming a semiconductor device comprising:
    disposing a light emitting diode and a semiconductor chip over a carrier comprising a lead frame;
    encapsulating the light emitting diode with a first encapsulating material, wherein the first encapsulating material is configured to absorb less than five percent of light emitted from the light emitted diode over a full range of wavelengths ranging from infrared light to ultra-violet light;
    encapsulating the semiconductor chip and the carrier with a second encapsulating material, wherein the second encapsulating material has a higher light absorption than the first encapsulating material;
    forming a through connection in the first encapsulating material; and
    forming a metallization layer over the through connection.

12. The method of claim 11, wherein the first encapsulating material is a polymer material.

13. The method of claim 12, wherein the second encapsulating material is an epoxy.

14. The method of claim 11, wherein the second encapsulating material is different from the first encapsulating material.

15. The method of claim 11, wherein the first encapsulating material is configured to absorb less than one percent of light emitted from the light emitted diode over a full range of wavelengths ranging from infrared light to ultra-violet light.

16. A semiconductor device comprising:
    a light emitting diode and a semiconductor chip disposed on a carrier comprising a lead frame;
    a first type of encapsulating material disposed over the light emitting diode, wherein the first type of encapsulating material is configured to absorb less than five percent of light emitted from the light emitted diode over a full range of wavelengths ranging from infrared light to ultra-violet light;
    a second type of encapsulating material disposed over the semiconductor chip and the carrier, wherein the second type of encapsulating material has a higher light absorption than the first encapsulating material;
    a through connection formed in the first type of encapsulating material; and
    a metallization layer disposed and structured over the through connection.

17. The device of claim 16, wherein the first type of encapsulating material is a polymer material, and wherein the second type of encapsulating material is an epoxy.

18. The device of claim 16, wherein the first type of encapsulating material and the second type of encapsulating material is a same material.

19. The device of claim 16, wherein the through connection is coupled to a contact pad of the light emitting diode.

20. The device of claim 16, wherein the first type of encapsulating material is a low light absorbing material.

21. The method of claim 1, wherein a coefficient of thermal expansion of the encapsulating material is less than 50 ppm/K.

\* \* \* \* \*